United States Patent [19]

Baldwin et al.

[11] 4,360,095
[45] Nov. 23, 1982

[54] FEED CHUTE FOR ELECTRONIC COMPONENTS

[75] Inventors: Wilbur A. Baldwin, Centerport, N.Y.; Richard Silverman, Clark, N.J.

[73] Assignee: Roto Form Sales Corp., Lake Grove, N.Y.

[21] Appl. No.: 147,844

[22] Filed: May 8, 1980

[51] Int. Cl.³ .............................................. B65G 1/02
[52] U.S. Cl. ...................................... 193/40; 29/759; 83/411 R; 83/648
[58] Field of Search ................... 193/38, 40; 83/409.2, 83/411 R, 648; 221/30, 73, 74, 241, 242; 29/759

[56] References Cited
U.S. PATENT DOCUMENTS 2,908,909 10/1959 Stolecki et al. ................... 221/74 X
3,421,284 1/1969 Zemek .............................. 221/30 X

OTHER PUBLICATIONS

Technical Devices Company; Mark V Component Lead Former & Model E Automatic Feed Chute.
General Production Devices; C.F. 7 Component Forming Machine with C.C.F. 7 Feeder.

Primary Examiner—Jeffrey V. Nase
Attorney, Agent, or Firm—Lawrence S. Lawrence

[57] ABSTRACT

A chute for feeding electronic components having axial wire leads into a machine for cutting and forming said leads includes spaced apart parallel plates defining therebetween a chamber for the bodies of the electronic components and has an elongated slot in each plate for receiving and guiding the axial wire leads thereof. The width of the slots and the distance between the plates are adjustable to accommodate components having varying body lengths and varying wire diameters. Wire retainers are also included to stop each component at the bottom of the chute and guide it into a position to be received and retained by the cutting and forming machine.

2 Claims, 5 Drawing Figures

FEED CHUTE FOR ELECTRONIC COMPONENTS

BACKGROUND OF THE INVENTION

Electronic components, such as resistors and capacitors, with wire leads extending axially from the ends thereof are often packaged by placement thereof in parallel juxtaposition with respect to one another and taping the ends of the axial leads together to form a ladder like structure. Such structure can be formed in continuous lengths and rolled into reels or formed in discrete lengths in the form of cards. In order to install the electronic components in the electronic devices in which they are employed, their axial leads must be cut to predetermined lengths and formed into a suitable shape for insertion in a printed circuit board. To accomplish this, machines have been developed and utilized for cutting and forming the axial leads of the components in the manner indicated. Such machines usually include means for stripping the electronic components from the cards or taped reels on which they are packaged.

Various cutting and forming machines have been provided in the past to process the axial leads of electronic components. Typical of these are the processing machines disclosed in the following United States Patents: U.S. Pat. No. 2,929,289 to Gorecki, U.S. Pat. No. 3,057,528 to Cole et al, U.S. Pat. No. 3,396,758 to Hall, U.S. Pat. No. 3,640,113 to Heller et al and U.S. Pat. No. 3,701,298 to Heller et al.

In addition to the foregoing machines, unpatented devices are also known in the art. These include the Mark V Component Lead Former, manufactured by Technical Devices Company, Division of Banner Industries, Culver City, Calif. and the CF7 Component Forming Machine, manufactured by General Production Devices of Van Dorf, Ontario. Unfortunately, each of the aforesaid patents and unpatented devices do not disclose feed mechanisms for introducing electronic components on cards into forming machines. On the contrary, they disclose devices adapted for the processing of transistor leads that do not have taped wires, and also disclose devices for receiving components having axial leads packaged in reels.

In the majority of these devices a pair of rotating gear shaped pickup wheels engage the axial leads of the components contained on the tape and carry the same past cutting and forming dies to accomplish the processing operation. In such process, the components are stripped from the taped carriers on which they are packaged.

To feed the components properly into the forming machine, feed guides are usually provided to engage the ends of the component bodies. In the feeding of cards containing electronic components with axial leads the devices that have been provided, such as the Model E Automatic Feed Chute, manufactured by Technical Devices Company and the CCF7 Feeder for Card Mounted Components, manufactured by General Production Devices, certain deficiencies have been found.

The most serious of these deficiencies is the inability of the feed devices to be adjusted to receive electronic components having varying wire diameters. As a result, in order to render the chute capable of receiving large as well as small diameter wire leads the chutes have been provided with extra wide slots. This does not properly guide the components into the forming machine and often results in damage to the components or jamming of the machines. In addition, existing card feed chutes deliver the electronic components directly into the teeth of the wheels on the forming machine, and do not provide a means by which the components can be carefully picked up by such wheels. This also creates the potential difficulty of jamming the machine and breaking the components.

It is the object of the present invention to provide a feed chute for axial lead cutting and forming machines which overcomes the difficulties found in the prior art.

SUMMARY OF THE INVENTION

In accordance with the present invention a feed chute for electronic components packaged in card form is provided for gravitationally feeding said components one at a time into a machine for cutting and forming the axial leads thereof into the desired size and shape. The chute includes a pair of spaced apart parallel plates defining therebetween a chamber for the bodies of the electronic components contained on the card and an elongated slot for receiving and guiding the axial wire leads of the components extending along the entire length of each plate in the center thereof.

Means are provided to adjust the distance between the plates so as to accommodate components having varying lengths. In addition, unlike the card feed chutes of the prior art the present invention includes means for adjusting the width of the slot to accommodate components having varying wire diameters. This insures that the components will be properly guided in the chute and will not be broken or bent in any way. The present invention also includes means to stop each component at the bottom of the chute and guide it into a position to be received by the cutting and forming machine, rather than feeding the components directly into pickup gears of such machines as is characteristic of the feed chutes found in the prior art.

The parallel plates are provided with flanges that extend longitudinally along the entire length of both edges thereof. A pair of spaced apart support brackets are included for mounting the flanges of the parallel plates; and the support brackets in turn are connected to a mounting arm which is provided with means to connect the entire feed chute assembly to the cutting and forming machine. The support brackets are provided with a plurality of slots through which suitable adjustment screws extend to engage corresponding openings in the flanges of one of the parallel plates to permit its movement to increase or decrease the width of the chamber between the plates to accommodate electronic components of various sizes.

The means for adjusting the slot width to accommodate wire diameters of different sizes comprises resilient members disposed between the flange on one side of each parallel plate and the adjacent support bracket. The resilient members are adapted to bias the portions of the parallel plates with which they are in contact into a position tending to reduce the size of the slotted opening. A plurality of adjustment screws extend through suitable openings in the support bracket, the resilient members and the corresponding flanges of the parallel plates. The tightening of said adjustment screws compresses the resilient members and opens the slot width. Conversely, the loosening of the screws allows the resilient member to move the parallel plates into a position to reduce the size of the slot width.

The resilient members can be a series of springs each disposed about an adjustment screw, or preferably an elongated gasket type compression member formed of rubber or plastic spongelike material. When gasket material is utilized, it is preferable to provide a bar in the shape of a channel disposed around each flange of the parallel plates to sandwich the gaskets therebetween. To insure proper alignment the channel is adapted to receive the flanges of the parallel plates, so that upon the tightening or loosening of the adjustment screws the plates will be uniformly moved.

The adjustment screws are preferably of the type having a knurled knob to permit hand adjustment. The end of the screws can be threaded directly into the flange of the parallel plates or into a locking bar having threaded openings disposed on the side of the flange opposite from the gasket. The means to stop each electronic component at the bottom of the chute and guide the same into a position to be received by the cutting and forming machine comprises a step formed in the bottom of each parallel plate and a pair of wire retainers, each disposed horizontally at the bottom of the slotted openings in each of the parallel plates. The retainer wires are spaced apart from the bottom of the plates so that as the components drop into contact therewith they may be moved horizontally therealong. In addition, the ends of the retainers are spaced apart from the steps formed in the plates a sufficient distance to permit the axial leads to pass therebetween. It is common in axial lead forming and cutting devices that the means for picking up the axial leads from the feed device comprises a pair of spaced apart coaxial gears having teeth which engage the wire leads. The feed chute of the present invention is positioned such that the teeth of the pickup gears contact the axial leads when the same are stopped by the retainer wires. At that point rotation of the gear causes horizontal movement of the electronic component along the retainer wires. At the end of the wires the electronic component passes between the steps and the wires and drops completely on to the gear and is carried thereby into the forming machine. To prevent the wire from falling out of the teeth of the gear during its transport from the chute to the forming apparatus, the parallel plates are formed with an arcuate shape extending downwardly from the end of the step and corresponding to the outside diameter of the pickup gears to retain the components on the gear until the same are cut and formed as desired.

The invention is further described with reference to the annexed drawings illustrating the preferred embodiment.

DETAILED DESCRIPTION OF PREFERRED EMBODIMENT

Figure 1:
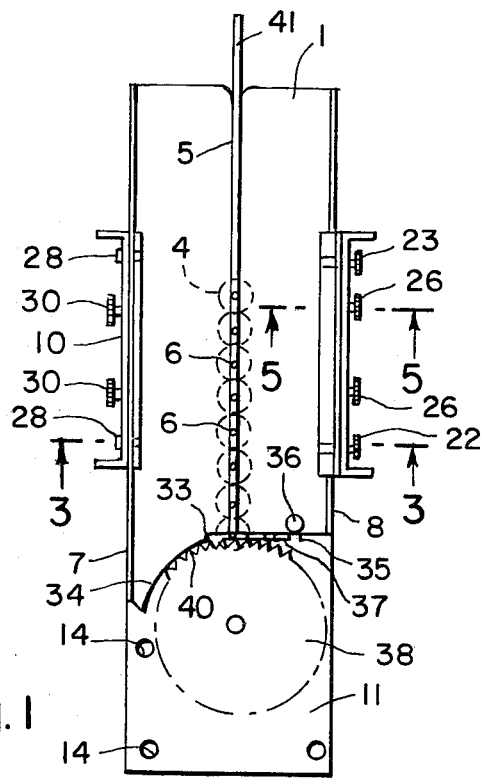
FIG. 1 is a front view of the feed chute of the invention.
Figure 5:
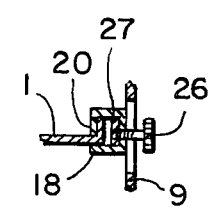
FIG. 5 is a cross-sectional view of the feed chute taken along the line 5—5 of FIG. 1.

Referring now to the drawings, the feed chute of the invention comprises a pair of spaced apart parallel plates 1 and 2 defining therebetween a chamber 3 for receiving the bodies of electronic components 4. Each of the plates 1 and 2 has an elongated slot 5 extending centrally along its entire length for receiving and guiding the axial wire leads 6 of the components 4. Both plates 1 and 2 are formed with a flange 7 extending along their entire lengths on one side and a flange 8 extending along their entire lengths on the other side. The flanges can best be seen in FIG. 3.

Figures 2, 3, 4:
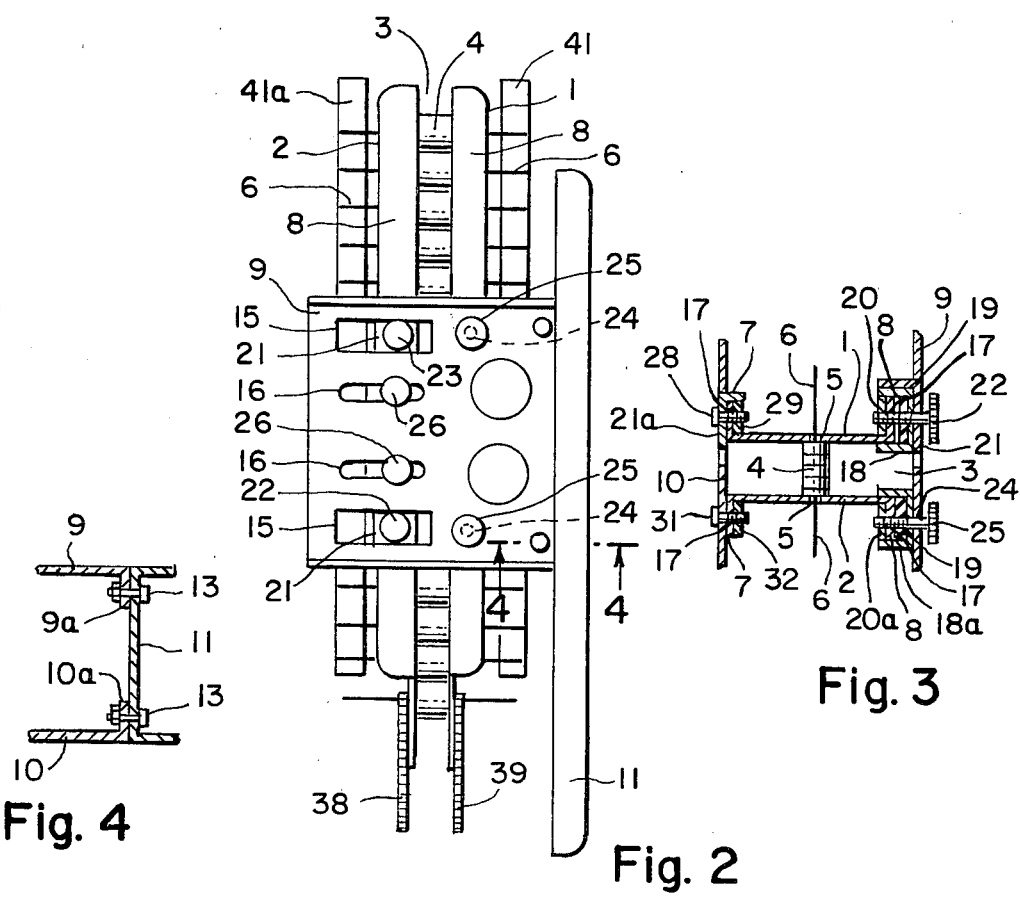
FIG. 2 is a side view of the feed chute of the invention taken along the line 2—2 of FIG. 1.
FIG. 3 is a cross-sectional view of the feed chute of the invention taken along the line 3—3 of FIG. 1.
FIG. 4 is a cross-sectional view of the feed chute of the invention taken along the line 4—4 of FIG. 2.

The parallel plates 1 and 2 are mounted in place by means of a pair of support brackets 9 and 10, which in turn are fixedly connected to an elongated mounting arm 11. For the latter purpose as shown in FIG. 4, brackets 9 and 10 are formed with flanges 9a and 10a respectively, each having a series of openings formed therein. Similarly, mounting arm 11 is also formed with a corresponding series of openings. A plurality of screws 13 extend through the openings in the flanges 9a and 10a and mounting arm 11 to rigidly connect the brackets to the mounting arm. In addition, mounting arm 11 is also formed with a series of openings 14 at the lower end thereof as shown in FIG. 1 to permit the connection of the entire chute assembly to the machine for cutting and forming the axial leads.

Each of the support brackets 9 and 10 contains a pair of rectangular slots 15 and a pair of elongated rounded slots 16. The flanges 7 and 8 of parallel plate 1 are formed with circular openings 17 juxtaposed adjacent to slots 15 and 16 for alignment with mounting and adjustment screws 22, 23, 26, 28 and 30 which extend through such slotted openings.

A pair of channel shaped bars 18 and 18a are disposed around flanges 8 of parallel plates 1 and 2, respectively, and extend along such flanges adjacent support bracket 9. Channel 18 is also formed with suitable openings that correspond with slots 15 and 16 of the support bracket 9 and channel 18a is formed with openings that correspond to a pair of openings 24 in support bracket 9. A strip of foam rubber material 19 is sandwiched between each of the flanges 8 of the parallel plates 1 and 2 and the channels 18 and 18a to bias said flanges in a direction to reduce the width of the slots 5 in the parallel plates 1 and 2.

In addition to the foregoing, locking bars 20 and 20a are disposed adjacent flanges 8 on each of the parallel plates 1 and 2, respectively, and contain threaded openings positioned to correspond with the openings formed in the flanges.

A pair of L-shaped guide brackets 21 are disposed in contact with the channel 18 of parallel plate 1 within each of the rectangular slots 15 in support bracket 9 to permit smooth sliding movement of the parallel plate 1 to increase or reduce the width of chamber 3 between plates 1 and 2 for the accommodation of variously sized electronic components 4.

A further pair of L-shaped guide brackets 21a are disposed about flange 7 of plate 1 within rectangular slotted opening 15 of support bracket 10, best seen in FIG. 3, to likewise permit sliding movement of the remaining portion of parallel plate 1 relative to parallel plate 2.

The width of slot 5 of the parallel plate 1 is controlled by means of adjustment screws 22 and 23 which extend through the L-shaped guide brackets 21, the channels 18, the resilient strip 19, flange 8 of parallel plate 1 and terminate within the threaded openings of locking bar 20. The tightening of screws 22 and 23 compresses the resilient material 19 to permit movement of flange 8 of plate 1 and thereby open the slot 5 thereof to accommodate the larger wire diameter electronic components. Similarly, the loosening of adjustment screws 22 and 23 permits the resilient material 19 to bias flange 8 of the parallel plate 1 into a position to reduce the width of slot 5.

The means for adjusting the slot width 5 of parallel plate 2, as shown in FIG. 3, includes all of the elements described hereinabove with the exception of the L-shaped guide bracket 21 which is not required, since plate 2 is not movable with respect to chamber 3. Accordingly, openings 24 are provided in support bracket 9 through which adjustment screws 25, which operate in the same manner as adjustment screws 22 and 23, extend.

Adjustment screws 26 extend through slots 16 in support bracket 9 and are provided to permit adjustment of the size of chamber 3 between the parallel plates 1 and 2 by permitting movement of plate 1. To secure plate 1 in the proper position adjustment screws 26 extend through channel 18 and engages suitable threaded openings formed in a secondary locking bar 27 disposed within channel 18. To permit locking bar 27 to be inserted within the channel, the resilient material 19 contains a space in the center thereof.

Flange 7 of plate 1 is movably mounted on support bracket 10 in a similar manner. A pair of L-shaped guide brackets 21a are disposed within slots 15 of bracket 10 for sliding movement of said plate 1 to increase or reduce the size of chamber 3 between the two parallel plates.

The two L-shaped brackets 21a associated with flange 7 of plate 1 are held in place by means of screws 28 which extend through suitable openings and terminate within a threaded opening in a locking bar 29, which is best seen in FIG. 3. To secure flange 7 of plate 1 in a proper location relative to plate 2, adjustment screws 30 extend through slots 16 of support bracket 10 through suitable openings formed in flange 7 and terminate within threaded openings in locking bar 29. It can be seen that the operation of such adjustment screws are the same as the operation of adjustment screws 26 which extend through and secure flange 8 in the proper location. Similarly, flange 7 of plate 2 is locked in a permanent position by means of screws 31 which extend through openings formed in both bracket 10 and flange 7 and terminate within a threaded opening formed in a further locking bar 32 disposed adjacent to flange 7.

The lower ends of plates 1 and 2 on that portion containing flange 7 as seen in FIG. 1 have formed therein a step 33 adjacent slot 5 and an arcuate section 34 extending from one end of step 33 to the bottom of the plates. The other end of step 33 is positioned in alignment with the bottom of that portion of the plates containing flange 8.

A wire spring retainer 35 is connected by means of screw 36 to the bottom of plate 1. A similar retainer, not shown, is also attached to the bottom of plate 2. The retainer has a horizontal portion 37 which extends along the bottom of the plates beneath slots 5 and terminates adjacent the end of step 33 spaced sufficiently from such step, however, to permit the passage therethrough of the axial wire leads of the electronic components.

The feed chute of the invention is adapted to be mounted upon an axial lead forming and cutting machine in a manner such that the gears or wheels utilized to receive the electronic components are positioned adjacent the arcuate bottom surface of plates 1 and 2.

This is illustrated best in FIG. 1 wherein a pickup gear 38 is shown. A second pickup gear 39 mounted co-axially with gear 38 is shown in FIG. 2. The pickup gears 38 and 39 contain a plurality of radially disposed teeth 40. As the pickup gears are rotated the teeth 40 engage the axial leads 6 of the lowermost electronic component 4 disposed within the feed chute and resting upon wire retainer 35. As the teeth engage the axial leads the continued rotation of the gears transports the electronic component along the wire retainer 35 until it fully drops into the teeth when it enters the space between the end of the wire retainer 35 and the step 33 formed on the plates. This arrangement insures that a single electronic component at a time will be fed into the forming machine. After the electronic component drops into the teeth, the arcuate shape 34 of the bottom of the plates retains the components within the teeth until the axial leads thereof are acted upon to be cut and formed by the machine. Upon the completion of such operation, the continued rotation of gears 38 and 39 permits the electronic components to pass the arcuate surface 34 and drop into a pickup container (not shown). It will be understood that the pick up gears are shown for illustrative purposes only and form no part of the within invention.

The electronic components 4 are contained on a pair of paper strips 41 and 41a by means of tape or glue. The tape strips permits the insertion into the feed chute of the invention of a plurality of electronic components at one time. As each electronic component is received by the teeth 40 of the pickup gears 38 and 39, it is stripped off the tape and carried into the machine for the appropriate operations.

Although this invention has been described with reference to a single embodiment, it will be apparent to those skilled in the art that other embodiments and modifications of the embodiments shown will fall within the scope of this invention.

What is claimed is:

1. A chute for feeding electronic components having bodies and axial wire leads into a machine for cutting and forming said leads into the desired size and shape comprising in combination, a pair of spaced apart substantially flat parallel plates defining therebetween a chamber for the bodies of the electronic components; said plates each having an elongated slot extending along the length thereof for receiving and guiding the axial wire leads of said components; means for adjusting the distance between the plates to accommodate components having varying lengths; means for adjusting the width of the slots to accommodate axial leads having varying diameters comprising means for mounting one side of each plate in a fixed position; means for mounting the opposite side of each plate for movement relative to the first side of each plate; resilient means for biasing said opposite side of each plate into a position to reduce the size of said slots; and a plurality of adjustment screws connected to said opposite side of the parallel plates adapted to overcome the biasing force of the resilient means to open the slot width when rotated in one direction, and to permit the biasing force of the resilient means to move the opposite sides of said parallel plates into a position to reduce the size of the slot width when rotated in the opposite direction; and means disposed at the bottom of said slots to stop each component and guide it into a position to be received and retained by the cutting and forming machine.

2. A chute for feeding electronic components having bodies and axial wire leads into a machine for cutting and forming said leads into the desired size and shape comprising in combination, a pair of spaced apart substantially flat parallel plates defining therebetween a chamber for the bodies of the electronic components; said plates each having an elongated slot extending along the length thereof for receiving and guiding the axial wire leads of said components; means for adjusting the distance between the plates to accommodate components having varying lengths; means for adjusting the width of the slots to accommodate axial leads having varying diameters; and means disposed at the bottom of said slots to stop each component and guide it into a position to be received and retained by the cutting and forming machine comprising a step formed at the bottom of each parallel plate adjacent the slot; a pair of wire retainers disposed horizontally along the bottom of the slot in each of the parallel plates, each extending over a slot and terminating in a position spaced apart from the bottom of the plates and the corresponding steps a sufficient distance to permit the horizontal sliding movement of the axial leads therealong and its passage between the steps and the wire retainers; and an arcuate surface formed at the bottom of each of said parallel plates adjacent to the step portion for retaining the electronic component within a pickup gear of the cutting and forming machine.

* * * * *